United States Patent [19]

Hess, Jr. et al.

[11] Patent Number: 4,740,790
[45] Date of Patent: Apr. 26, 1988

[54] ANTENNA POLARIZATION MEASURING METHODS

[75] Inventors: Doren W. Hess, Jr., Norcross; John R. Jones, Lawrenceville, both of Ga.

[73] Assignee: Scientific-Atlanta, Inc., Atlanta, Ga.

[21] Appl. No.: 775,364

[22] Filed: Sep. 12, 1985

[51] Int. Cl.[4] ............... H01Q 21/06; H01Q 21/24; H04B 7/10

[52] U.S. Cl. .................................. 342/361; 342/360

[58] Field of Search ............ 342/360, 361, 362, 363, 342/364, 365, 366, 173

[56] References Cited

PUBLICATIONS

E. Christensen, J. Hansen, et al., *Experimental Spherical Near-Field Antenna Test Facility,* Phase II Final Report, Electro-Magnetics Institute, Technical University of Denmark, European Space Agency Contract Report, pp. 93–99, 10-1-10-17, 11-1-11-26, Dec. 1981.

C. Foley and J. Lamb, "Use a Personal Computer and DFT to Extract Data from Noisy Signals," EDN, vol. 29, No. 7, pp. 215–222, 224, 227–228, 230, and 232, Apr. 5, 1984.

T. Hickman, J. Hollis and L. Clayton, "Polarization Measurements," Chapter 10 of *Microwave Antenna Measurements,* J. Hollis, T. Lyon and L. Clayton, eds., Scientific Atlanta, Inc., pp. 10-1-10-38, 10A1-10A4, Atlanta, Ga., 1970.

E. Joy and D. Paris, "A Practical Method for Measuring the Complex Polarization Ratio of Arbitrary Antennas," IEEE Transactions on Antennas and Propagation, vol. AP-21, No. 4, pp. 432–435, Jul., 1973.

A. Newell, "Improved Polarization Measurements Using a Modified 3-Antenna Technique," Proceedings of the IEEE International Antennas and Propagation Symposium, Urbana-Champaign, IL, Jun. 2–4, 1975, pp. 337–340, 1975.

A. Newell and D. Kerns, "Determination of Both Polarization and Power Gain of Antennas by a Generalized 3-Antenna Measurement Method," Electronics Letters, vol. 7, No. 3, pp. 68–70, Feb. 11, 1971.

A. Newell, R. Baird and P. Wacker, "Accurate Measurement of Antenna Gain and Polarization at Reduced Distances by an Extrapolation Technique," IEEE Transactions on Antennas and Propagation, vol. AP-21, No. 4, pp. 418–431, Jul., 1973.

P. Wacker, "Non-Planar Near-Field Measurements: Spherical Scanning," NPSIR 75-809, (55 pages), Jun. 1975.

*Primary Examiner*—Theodore M. Blum
*Attorney, Agent, or Firm*—Kilpatrick & Cody

[57] ABSTRACT

Method for measuring polarization of antennas utilizing three-antenna methods and far-field scanning techniques where the measured data is processed via digital Fourier transform. In one method, the normalized received phasor voltage for transmission between each of three antennas measured pairwise is digitally recorded as a continuously sampled function of relative roll angle between the antennas as one of the antennas is rolled in a continuous manner. The recorded data is digitally processed via a one-dimensional Discrete Fourier Transform to yield transformed quantities relating to the polarization of the antennas under test. From these quantities, standard polarization parameters including the circular polarization ratio, axial ratio, tilt angle and sense of the electric field polarization ellipse of each antenna may be obtained. In another method, the antenna in each pair which is not continuously rotated is rotated in incremental fashion while the normalized received phasor voltage for transmission between each pair of antennas is digitally recorded. The recorded data for this second method is digitally processed via a two-dimensional Fast, Discrete or other Fourier transform. This step/scan procedure further compensates for test range ambient and reflected noise and for transmitter and receiver RF path variations compared to the single scan procedure of the first method.

25 Claims, 5 Drawing Sheets

A) Position first antenna and second antenna on an antenna test range in far-field conditions.

B) Transmit continuous wave signal from one of the antennas.

C) Rotate one of the antennas about its roll axis through a predetermined angle.

D) Digitally record normalized phasor voltage of the received signal as a function of the roll angle.

E) Position second antenna and third antenna on the test range.

F) Repeat steps B through D.

G) Position first antenna and third antenna on the test range.

H) Repeat steps B through D.

I) Digitally process received data utilizing a Discrete Fourier Transform to yield transformed values related to the polarization of the first, second and third antennas.

FIG 4

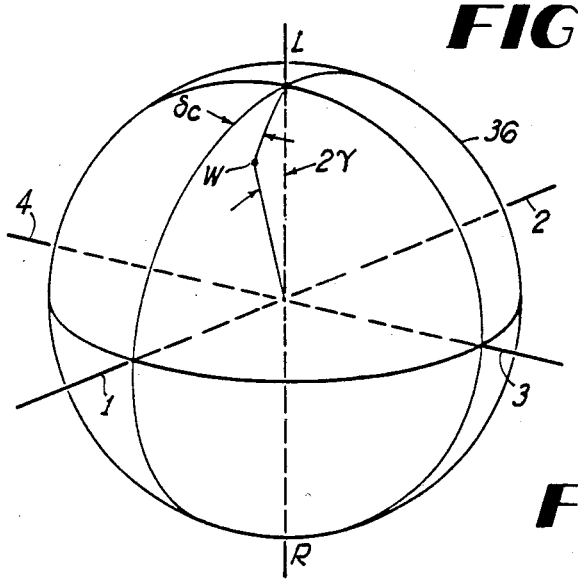

FIG 5

POLARIZATION PARAMETERS FROM FILE DF1MS3

| FREQUENCY (MHz) | AXIAL RATIO (dB) | SENSE | TILT ANGLE (DEGREES) |
|---|---|---|---|
| 13000.0 | 53.22 | RHE | 88.98 |

ALTERNATIVE POLARIZATION REPRESENTATIONS

| BASIS | COMPLEX POLARIZATION RATIOS | | POINCARE SPHERE COORDINATES | |
|---|---|---|---|---|
| | AMPLITUDE | PHASE (DEGREES) | POLAR ANGLE (DEGREES) | LONGITUDE (DEGREES) |
| CIRCULAR | 1.0044 | 177.9580 | 90.25 | 177.96 |
| LINEAR | 55.6969 | -6.9888 | 177.94 | -6.99 |
| DIAGONAL | .9650 | -.2504 | 87.96 | -.25 |

*FIG 6*

ANTENNA POLARIZATION MEASURING METHODS

BACKGROUND OF THE INVENTION

This invention relates to three-antenna methods for measuring antenna polarization. Polarization measurements to determine tilt angles, axial ratios and sense of electric field polarization ellipses of antennas by means of procedures carried out on antenna measurement ranges are well known. In general, these parameters are functions of direction, and a polarization measurement of the field of an antenna must therefore be made at each pattern direction of interest. Such solid angle antenna polarization measurements require knowledge of the polarization of the range antenna with which the measurement is made.

When the range antenna itself has unknown polarization characteristics, a three-antenna polarization measurement is performed to determine the polarization characteristics of the range antenna. Because of the complexity of the data reduction associated with a three-antenna polarization measurement procedure, such a procedure is usually limited to determining the polarization of an antenna in only one direction of radiation pattern. By performing polarization pattern measurements on each of the three possible pairs of antennas in a three-antenna set, one is able to ascertain the axial ratio, tilt angle and sense of the polarization ellipse for each of the three antennas. Typically, the polarization for the direction of the peak of the beam for each of the three antennas is measured. The only apriori knowledge required is the approximate tilt angle (within 45 degrees) of one of the antennas in the three-antenna set and the fact that one of the antennas is reciprocal.

According to a previously known three-antenna measurement technique, a first pair of antennas is positioned on a test range at a sufficient distance from one another to satisfy far-field conditions and so that they share a common boresight or roll axis. The receiving antenna is rotated in a selected direction about its roll axis until a minimum transmission voltage is located, and then rotated 90° in the opposite direction. In this orientation, the amplitude is set to one, the phase to 0° and the rotation angle from the roll angle reference is recorded. The receiving antenna is again rotated to the minimum location, where the direction of phase change during rotation and the amplitude at the minimum are recorded. This process is repeated for the other two pairs of antennas and polarization ratios are calculated from this data. The tilt angle for each antenna is determined from the measured rotation angles. Aspects of such techniques are described in Newell, A. C., "Improved Polarization Measurement Using a Modified Three-Antenna Technique", *Proceedings of the IEEE International Antennas and Propagation Symposium*, Urbana-Champaign, Ill., June 2-4, 1975, Session 15, pp. 337-340, 1975. Other three antenna polarization measurement techniques, less accurate in general than that referred to above, are described in Newell, A. C., and Kerns, D. M., "Determination of Both Polarization and Power Gain of Antennas by a Generalized 3-Antenna Measurement Method", *Electronic Letters*, Vol. 7, No. 3, pp. 68-70, Feb. 11, 1971; Joy, E. B., and Paris, D. T., "A Practical Method for Measuring the Complex Polarization Ratio of Arbitrary Antennas", *IEEE Transactions on Antenna and Propagation*, Vol. AP-21, No. 4, pp. 432-435, July, 1973; and Newell, A. C., Baird, R. F., and Wacker, P. F., "Accurate Measurement of Antenna Gain and Polarization at Reduced Distances by an Extrapolation Technique", *IEEE Transactions on Antennas and Propagation*, Vol. AP-21, No. 4, pp. 418-431, July, 1973. All of those publications are incorporated herein by this reference.

Certain inaccuracies are inherent in such measurement techniques, however. First, the polarization ratios for the antennas in measurements such as those described in the references above are computed from only two measured received phasor voltages for two relative roll angles of the antennas. The measured data for these two orientations is subject to corruption by the presence of ambient and reflected energy in the test range, by variations in the transmitter and receiver radio-frequency (RF) paths, and by random instrumentation errors.

Second, because the transmitting antenna is fixed, rather than being rotated, the measurement procedures described in the references above all fail to account for ambient and reflected energy in the test range and for variations in the RF path connecting the rotating antenna to the fixed portions of the measurement system.

Third, each of the methods of the references described above, except for the first, require extremely accurate measurements of relative phase between the two measurement orientations of each pair of antennas. In some unusual measurement situations involving these methods, all of the polarization information in the measurement may be contained in the phase measurement. Measurement of relative phase is inherently more difficult and less accurate than measurement of relative amplitude, so that all of the other methods described in the references above are inherently less accurate than that described in the first reference.

Finally, the method described in the first reference requires use of three coordinate systems, one fixed by reference to each antenna and one fixed in space by reference to the test range. Coordinate system redefinition is a requirement when using this process, and this redefinition may lead to confusion and errors.

A three-antenna antenna polarization measurement method in which one antenna in each pair of antennas is rotated about the common axis, the phase and amplitude of the received signal is sampled for every degree in a 0°-360° rotation and such data is converted in a minicomputer via Fast Fourier Transform ("FFT") is disclosed in E. L. Christensen, et al., *Experimental Near Field Antenna Test Facility Phase 2 Final Report* (European Space Agency Contract Report, Contract No. 3916/79/NL/DG) pp. 93-99 (vol. 1 December, 1981) (the "Technical University of Denmark Report"), which is incorporated herein by this reference. This report describes work carried out by the Electromagnetics Institute at the Technical University of Denmark.

SUMMARY OF THE INVENTION

In the antenna polarization measurement methods of the present invention, amplitude and phase of the received signal comprising one or more frequencies is measured and recorded digitally and continuously as one or both of the antennas are continuously moved through a range of rotation angles. In one embodiment, only one of the antennas is rotated. The motion of the antenna may consist of rotation through a 180° angular sector, a 360° angular sector, or an angular sector which is a multiple of 180°. In another embodiment, both of the antennas are rotated through angular sectors as described above, one antenna being rotated continuously and the other antenna being rotated in an incremental (stepwise) fashion. A number of data points are thus recorded for digital processing.

These data are processed digitally utilizing a Fourier transform to digitally filter ambient and reflected noise, RF path variations, and random measurement receiver errors from the received signal. Fourier transform techniques filter the measured data as a function of angle in the spatial frequency domain and leave only the spatial frequency components that vary with angle as polarization patterns ideally should. Products of the circular polarization ratios of the antenna pairs are thus obtained and may be utilized to calculate the circular polarization ratios for the individual antennas by solving the resulting system of three equations in three unknowns. Other antenna polarization parameters including linear or diagonal polarization ratio, axial ratio and tilt angle may be readily computed using the antenna circular polarization ratios.

Unlike the Technical University of Denmark Report method, applicants' single-scan method uses a Discrete Fourier Transform ("DFT"), which may, but need not be, a single frequency DFT. Because the Technical University of Denmark Report method requires use of a FFT, it requires fairly complex software to yield spectra at equal and linear increments for various frequencies, only one of which is necessary to calculate the circular polarization ratios for the antennas being tested according to applicants' method. Further, because information relating to these various extra frequencies is generated by the FFT, additional and unnecessary computing time and memory space are required.

The Technical University of Denmark Report also indicates a 360° scan of one antenna in each pair and sampling of the received signal at every degree. Applicants have found, however, that in some instances acceptable and accurate values may be obtained by sampling the received signal as an antenna is rotated through a 180° angular sector or other angular sector which is a multiple of 180°. Further, applicants have found that the sample increment has only a secondary influence on the accuracy of measurements according to their method, and sample increments of greater than one degree may produce accurate and acceptable results in many instances.

Applicants have discovered that rotating both antennas in each pair, rather than merely one as is indicated in the Technical University of Denmark Report, produces significant improvements in measurement accuracy. Multiple scan measurements according to applicants' method, together with the use of a two-dimensional instead of a one-dimensional Fourier transform significantly reduces periodic errors as compared to single scan data reduction involving only one dimensional Fourier transform.

It is thus an object of the present invention to measure antenna polarization utilizing a large number of data points corresponding to the normalized received phasor voltage at various antenna rotation angles while maximizing computational efficiency.

It is an additional object of the present invention to measure antenna polarization for one or more frequencies according to a method in which both the receiving antenna and the transmitting antenna may be rotated, and a two-dimensional rather than a one-dimensional Fourier transform is used for additional accuracy.

It is an additional object of the present invention to measure antenna polarization according to a single scan method in which only one antenna in each pair is rotated, and the information corresponding to a received signal of a set of frequencies or of one frequency is digitally processed by DFT techinques to simplify calculations required by computer so that less time and memory space is required.

It is an additional object of the present invention to measure antenna polarization according to a single scan method in which only one antenna in each pair is rotated through angular sectors of 180° or multiples thereof.

It is an additional object of the present invention to measure antenna polarization without the need for a polarization standard, and knowing the approximate tilt angle of one of the three antennas, that at least one of the antennas is reciprocal, and that no more than one of the antennas is identically circularly polarized.

It is an additional object of the present invention to measure antenna polarization according to a method in which both the receiving antenna and the transmitting antenna may be rotated to reduce the effect of antenna range ambient and reflected energy or noise and variations in both the transmitter and receiver RF signal paths.

It is an additional object of the present invention to measure antenna polarization utilizing digital DFT techniques to digitally filter ambient and background noise from the signal received by the receiving antenna.

It is an additional object of the present invention to measure antenna polarization ratios using three-antenna methods and far-field techniques with the aid of DFT techniques.

It is a further object of the present invention to measure antenna polarization without the need to redefine coordinate systems for the antenna range or either antenna.

It is a further object of the present invention to provide antenna circular polarization ratios, axial ratios and tilt angles economically and quickly through the use of an easily automated step-by-step polarization measurement method which does not call for extensive familiarity on the part of the users with the theory involved in the data reduction.

Other objects, features and advantages of the present invention will become apparent with reference to the remainder of the specification, claims and drawings.

BRIEF DESCRIPTION OF THE DRAWINGS

FIG. 4 is a flow chart showing a method according to the present invention for measuring antenna polarization in which only one of the antennas of each pair is rotated.

FIG. 5 is a schematic illustration fo a Poincare sphere each point on which is associated with a single polarization state of an antenna or wave.

FIG. 6 is a sample polarization parameters output list generated by applicants' program of the present invention.

DETAILED DESCRIPTION OF THE DRAWINGS

I. Procedure

Figure 1:
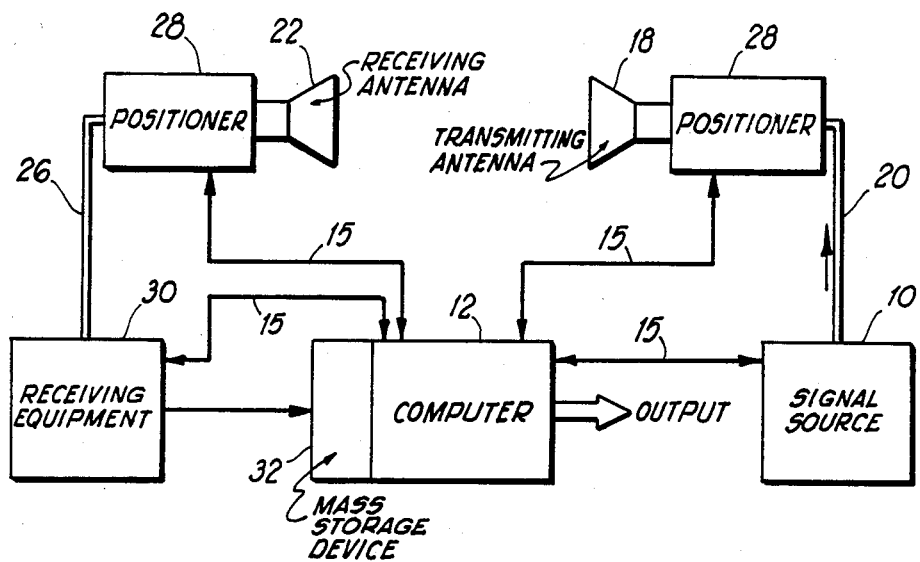
FIG. 1 is a schematic view of the transmission, reception and data processing equipment utilized according to the present invention.

The transmitting, receiving, positioning, and computing equipment required for measurement procedures according to the present invention is shown schematically in FIG. 1. A continuous-wave (CW) RF signal 8 is generated by a signal source 10. The source 10 is capable of producing CW signals at various frequencies. The source may be under the control of a computer 12, but this is not necessary. Computer 12 may be a conventional mini-computer such as a Hewlett-Packard HP-1000.

The CW signal 8 is guided to the transmitting antenna 18 by a coaxial cable 20 or other transmission line, or by a waveguide. The transmitting antenna 18 is one of the antennas in the three antenna set used in accordance with the present invention, and its polarization characteristics are, in general, unknown. The transmitting antenna 18 radiates electromagnetic energy which is received by the receiving antenna 22. The receiving antenna 22 is also one of the antennas in the three antenna set, and its polarization is also, in general, unknown. Either or both of the antennas 18 or 22 may be mounted on a rotary positioner 28 such as is conventional in the art. Rotary positioners 28 may be controlled by computer 12 which produces control signals 15.

CW signal 8 appearing at the port of the receiving antenna 22 is guided to the receiving equipment 30 by a coaxial cable 26, transmission line, or waveguide. There may be an RF rotary joint (not shown) in either the transmitter or the receiver transmission line to enable conduction of the signal through the rotary positioner 28 on which the antenna (either transmitting 18 or receiving 22) is mounted.

In a first method according to the invention, both positioners 28 are controlled by control signals 15 from computer 12. In a second method, one of the positioners 28 on which the antennas are mounted is controlled by the computer 12. The nature of this control in either event is such that positioner motion may be initiated or stopped by the computer 12, the speed of rotation may be set by the computer 12, and the computer 12 or the receiving equipment 30 is supplied with a sensor input indicating the angle to which the positioner 28 is rotated as a function of time.

The CW signal 8 which is guided to the receiving equipment 30 is converted to a digital representation. This representation includes both phase and amplitude information. The receiving equipment 30 is computer 12-controlled so that it can transfer the digital representation of the signal 8 received at the port of the receiving antenna 22 to a mass storage device 32 comprising random access or other suitable memory.

The mass storage device 32 stores the digital representation of the signal 16 received at the port of the receiving antenna 22. The mass storage device 32 is used to produce a permanent record of the experimental data, and it supplies the data to the computer 12 for computation of the polarization ratios.

The computer 12 controls all computer-controlled equipment in the measurement setup. It also computes the circular polarization ratios from the measured data and the alternate polarization representations from the circular polarization ratios.

The procedure for any three-antenna polarization measurement method is to measure the relative received phasor voltage for the three antennas taken pairwise. The voltage as a function fo rotation about the line of sight is recorded. This rotation is described by the angles $\chi$ and $\phi$ shown in FIG. 2. It should be noted, however, that the rotation for either antenna need not always be in the same direction; time may be saved, for example, by scanning one or both antennas first in one direction, then in the other. The measured data is reduced using expressions for the polarization parameters in terms of the relative received phasor voltage such as those stated in the "Mathematical Basis" section below.

Figure 2:
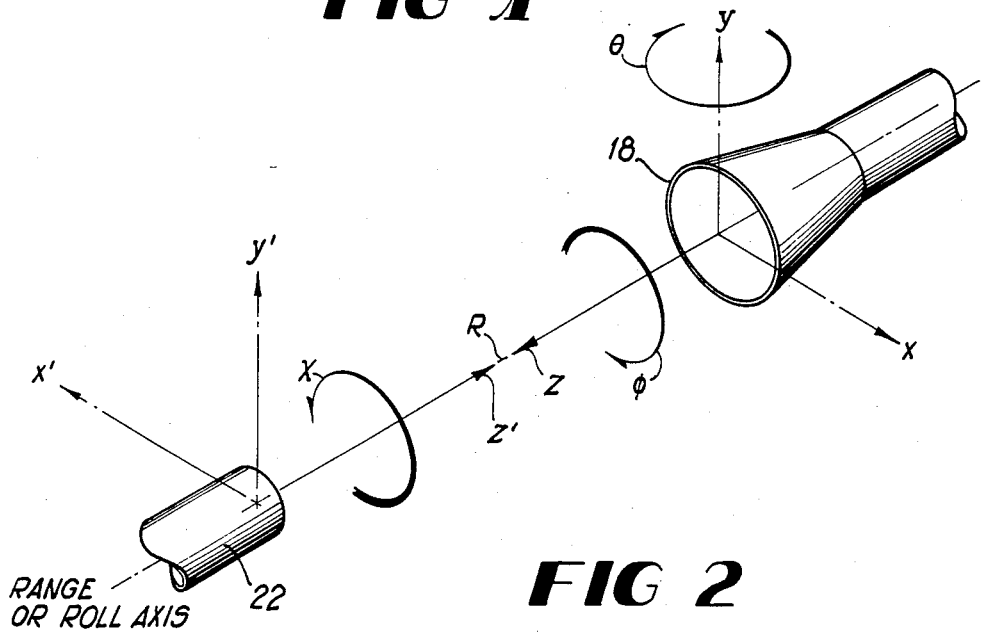
FIG. 2 is a schematic perspective view of the test range coordinate system utilized according to the present invention.

The coordinate systems shown in FIG. 2 are those which are important for any three antenna polarization measurement procedure. FIG. 2 illustrates one pair of the three antenna set. Each of the antennas is mounted on a positioner 28 which provides rotation of the antenna about the z-axis of its attached coordinate system. The antenna which is mounted on the positioner 28 which would be used as the test antenna positioner in an antenna pattern measurement configuration is designated the "antenna under test" (AUT). The antenna which is mounted on the positioner 28 which would be used as the range antenna positioner in such a configuration is designated the "range antenna." It is important to realize, however, that the polarization of all of the antennas in the three antenna measurement is in general unknown. The designations "AUT" and "range antenna" are used simply for convenience in differentiating the two antennas of this antenna pair. For the range antenna, which may be either the transmitting antenna 18 or the receiving antenna 22, the rotation about the z'-axis is described by the angle $\chi$ measured from the range antenna's x'-axis in a clockwise direction when viewed from the AUT. For the AUT, which also may be either the transmitting antenna 18 or the receiving antenna 22, the rotation about the z-axis is described by the angle $\phi$ measured from the AUT's x-axis in a clockwise direction when viewed from the range antenna.

Initial alignment of the antenna coordinate system is important with any three-antenna polarization measurement method because of the need to maintain a constant orientation reference for measurement of the tilt angle. The coordinate systems of the antennas in the measurement must be defined by mechanical reference devices such as bubble levels mounted on the antennas, as is conventional in the art. The measurement procedure described herein is used to measure directly the polarization of antennas in the coordinate systems so defined. No coordinate system redifinition is required. In practice, this means that the atennas are mounted with their mechanical reference devices in their reference orientation (e.g. with their bubble levels level). The angular offsets in $\chi$ and $\phi$ corresponding to this condition are noted and these offsets used to define the zero rotation angles for the coordinate systems.

The complex voltage (phase and amplitude) at the port of a receiving antenna 22 is measured by phase/amplitude receiver 30 and digitally recorded as one of the antennas is scanned. This scanning consists of rotating the transmitting antenna 18 through an angle $\phi$ or the receiving antenna through an angle $\chi$.

For single scan polarization measurements, which are reduced to polarization parameters by means of a one-dimensional DFT, this is the only measurement that is required for each antenna pair. The sample increment has only a secondary influence on the accuracy of the measurement. Empirical results indicate that no further improvements in measurement accuracy result from use of sample increments less than 1°.

For multiple scan polarization measurements, the antennas 18 and 22 are rotated in a step-scan fashion. Following acquisition of single scan data as described above, the antenna which was held stationary relative to the range or roll axis, and whose polarization axis was not used for the scan (logically, this axis may be referred to as the step axis) is rotated through a discrete angular increment about the step axis and the scan of the other antenna is repeated. The phase and amplitude data are recorded as functions of both the step and scan axis angles $\chi$ and $\phi$, and a two-dimensional FFT, DFT or other Fourier transform is used for reduction of the measured coupling data to polarization parameters. As in the single scan measurements, neither the step nor the scan angle increment has a profound influence on the accuracy of the measurement. Empirical results indicate that no significant improvements in measurement accuracy result from use of step angle increments less than 15°.

Polarization measurements according to either of applicant's single scan or multiple scan techniques may be made for a set of frequencies rather than for merely one frequency. As the rotating antenna rotates through a predetermined portion of the predetermined angle through which it is programmed to rotate, a set of predetermined frequencies is transmitted from one of the antennas, received by the other, and digitally recorded. This process is repeated for successive predetermined portions of the sweep of the rotating antenna through the predetermined angle and the information is digitally processed. The set of predetermined frequencies comprises preferably no more than ten (10) frequencies but more may be used. The set need not be transmitted in any particular order; the predetermined frequencies in the set may be transmitted repeatedly in the same order or the order may be varied. For instance, the set may be transmitted from lowest to highest frequency and then from highest to lowest. The computer 12 is programmed to accept antenna orientation, phase and amplitude information and compute, using a Fourier transform, circular polarization ratio products. Conventional programming techniques may be utilized, and a DFT program may be written in the FORTRAN language. Such programming techniques are discussed in, for instance, C. Foley and F. Lamb, "Use a Personal Computer and DFT to Extract Data from Noisy Signals," *Electronic Design News*, p. 215 (Apr. 5, 1984) which is incorporated herein by this reference. DFT and FFT techniques are also discussed in E. Brigham, *The Fast Fourier Transform* (1974); and A. Oppenheim and R. Schafer, *Digital Signal Processing* (1975), both of which works are incorporated herein by this reference. FFT programs are commercially available. Conventional programs may also be written to control positioners 28 for positioning transmitting antenna 18 and receiving antenna 22. A sample polarization parameters output list generated by applicants' program is shown in FIG. 6.

Figure 3:
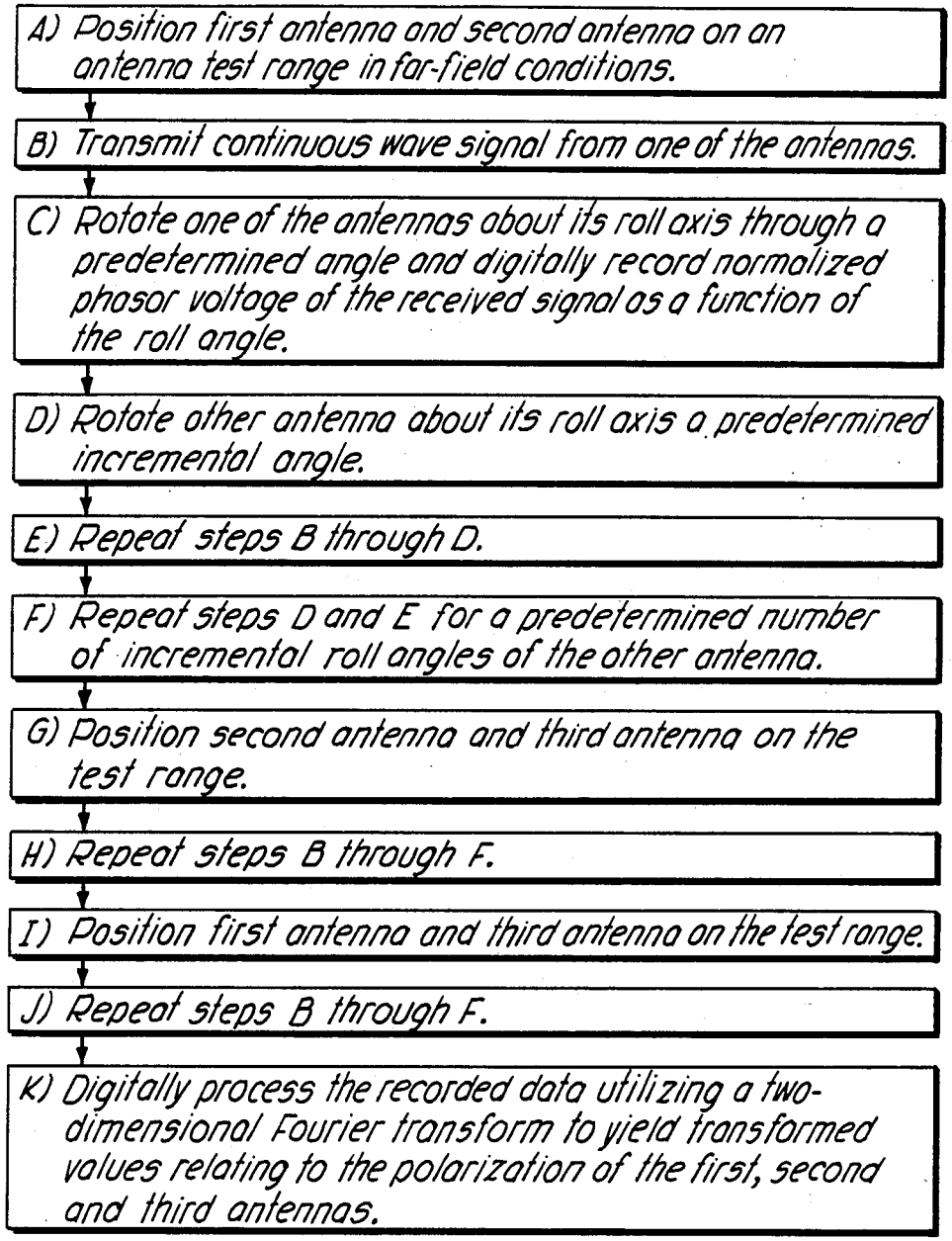
FIG. 3 is a flow chart showing a method according to the present invention for measuring antenna polarization in which both the receiving and transmitting antennas are rotated.

FIG. 3 is a flow chart showing applicants' multiple scan method according to the present invention for measuring antenna polarization in which both the receiving antenna 22 and transmitting antenna 18 are rotated.

FIG. 4 is a flow chart showing the steps involved in applicants' single scan method according to the present invention for measurement of antenna polarization for one frequency in which only one of the antennas of each pair is rotated. In the figure, the receiving antenna 22 may be rotated, but the transmitting antenna 18 could be rotated with equivalent results.

Figure 4A:
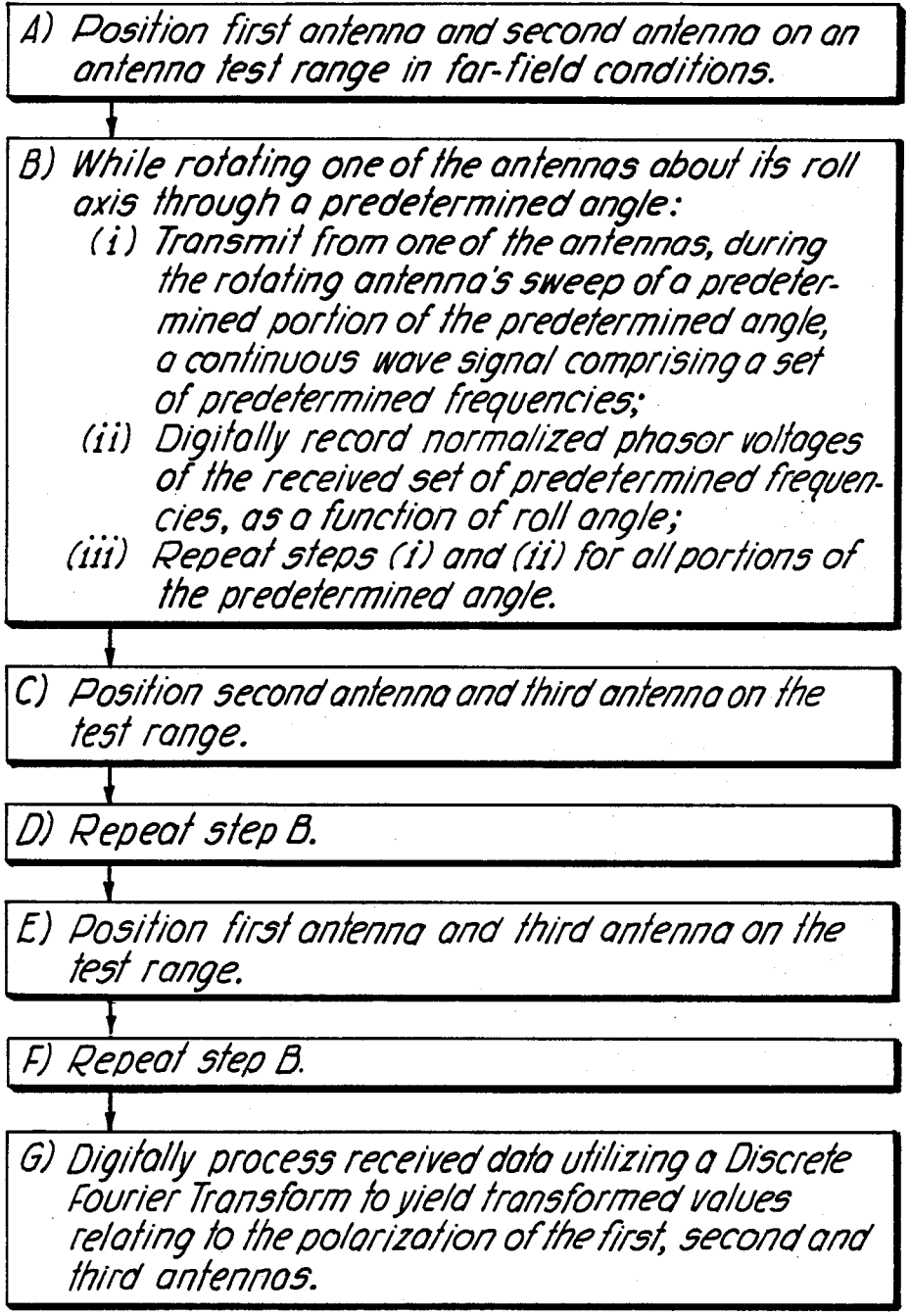
FIG. 4A is a flow chart showing a method according to the present invention for measuring antenna polarization for more than one frequency in which only one of the antennas of each pair is rotated.

FIG. 4A is a flow chart showing the steps involved in applicants' single scan multiple frequency method according to present invention for measurement of antenna polarization for a set of frequencies. Once again, the receiving antenna 22 may be rotated, but the transmitting antenna could be rotated with equivalent results. Such multiple frequency measurement may also be used, of course, in connection with applicants' multiple scan methods.

II. Mathematical Basis

The three antenna method of the present invention is carried out by measurement of the polarization patterns between successive pairs of antennas. The measurement configuration has a transmitting antenna 18 transmitting an illuminating wavefront that is received by the receiving antenna 22. For a given pair of antennas 18 and 22 the relative received phasor or normalized voltage response is given by the matrix product $$\hat{v} = (W_r, W_t) = W_r^\dagger W_t \quad (1)$$

where the superscript $\dagger$ denotes the complex conjugate of the transpose of a matrix and where the $W_r$ and $W_t$ are column matrices $$W_t = \begin{bmatrix} \cos \gamma_t \\ \sin \gamma_t \, e^{j\delta ct} \end{bmatrix} \begin{bmatrix} W_r = \begin{array}{c} \cos \gamma_r \\ \sin \gamma_r \, e^{j\delta cr} \end{array} \end{bmatrix} \quad (2)$$

$W_t$ is the polarization column vector of the transmitting antenna, that is, $W_t$ is the polarization column vector of the wave which is incident on the receiver. $W_r$ is the polarization column vector of the receiving antenna, that is, $W_r$ is the polarization column vector of the wave to which the receiving antenna is perfectly polarization-matched.

The polarization matrices are related mathematically to the angles which specify the polarization of a wave by the location of its corresponding point on the Poincaré sphere 36. FIG. 5 is an illustration of the Poincaré sphere 36 showing the polar angle $2\gamma$ and the longitude $\delta_c$. Each point of the Poincaré sphere 36 is associated with a particular polarization state of a wave. There is a one-to-one mapping between points on the sphere and possible polarization states of the wave. The polar angle $2\gamma$ and the longitude $\delta_c$ are shown designating the polarization of the wave, with the poles of the sphere designating left-hand and right-hand circular polarization states.

If the antennas 18 and 22 are physically rotated about the range axis, which is the line-of-sight joining them, the polarization matrices take on the following parametric dependence on the rotation angles $\phi$ and $\chi$:

$$W_t(\phi) = \begin{bmatrix} \cos \gamma_t \, e^{+j\phi} \\ \sin \gamma_t \, e^{+j\delta ct - j\phi} \end{bmatrix} \quad (3)$$

and $$W_r(\chi) = \begin{bmatrix} \cos \gamma_r \, e^{-j\chi} \\ \sin \gamma_r \, e^{+j\delta cr + j\chi} \end{bmatrix} \quad (4)$$

Then $$V(\phi,\chi) = \cos \gamma_t \cos \gamma_r \, e^{j(\phi+\chi)} + \sin \gamma_t \sin \gamma_r \, e^{-j(\phi+\chi+\delta cr-\delta ct)} \quad (5)$$

where the time dependence $e^{+jwt}$ has been assumed. The angles $\phi$ and $\chi$ are the angles through which the transmitting antenna 18 and receiving antenna 22 respectively are rotated in the clockwise direction as each is viewed from the other. FIG. 2, mentioned above, illustrates the coordinate systems for the polarization measurements and defines the rotation angles.

Equation (5) will be recognized as a simple two-dimensional Fourier series in the angles $\phi$ and $\chi$. Only two spatail frequency components in each variable are present—the positive and negative single cycle per cycle harmonics.

The coefficients of the Fourier series can be computed from the known parametric dependence of $\hat{V}$ on $\phi$ and $\chi$ by inversion:

$$\cos \gamma_t \cos \gamma_r = \left(\frac{1}{2\pi}\right)^2 \int_0^{2\pi}\int_0^{2\pi} V(\phi,\chi) \, e^{-j(\phi+\chi)} \, d\phi d\chi \quad (6)$$

and $$\sin \gamma_t \sin \gamma_r \, e^{-j(\delta cr - \delta ct)} = \quad (7)$$

$$\left(\frac{1}{2\pi}\right)^2 \int_0^{2\pi}\int_0^{2\pi} V(\phi,\chi) \, e^{+j(\phi+\chi)} \, d\phi d\chi$$

The ratio of these two quantities yields the following:

$$M = \left(\frac{\sin \gamma_t \, e^{+j\delta ct}}{\cos \gamma_t}\right)\left(\frac{\sin \gamma_r \, e^{-j\delta cr}}{\cos \gamma_r}\right) = \quad (8)$$

$$= \tan \gamma_t \, e^{+j\delta ct} \tan \gamma_r \, e^{-j\delta cr}$$

$$= \hat{\rho}_{ct} \, \hat{\rho}_{cr}^*$$

where $\hat{\rho}_{ct}$ is the circular polarization ratio for the transmitting antenna and $\hat{\rho}_{cr}$ is receiving circular polarization ratio for the receiving antenna.

Using the relation for a reciprocal antenna between the receiving circular polarization ratio and the transmitting circular polarization ratio that $$\hat{\rho}_{cr}^* = \hat{\rho}_{ct} \quad (9)$$

this result (8) becomes simply $$\hat{\rho}_c \hat{\rho}_c = M \quad (10)$$

where $\hat{\rho}_{ct}$ is written $\hat{\rho}_c$ and $\hat{\rho}_c'$ has replaced $\hat{\rho}_{cr}^*$. Now, both circular polarization ratios for the two antennas 18 and 22 refer to transmission and the prime differentiates the two antennas.

Once the products of the complex circular polarization ratios for each of the three antenna pairs are determined from successive polarization measurements, one can compute each of the circular polarization ratios from three equations in three complex unknowns derived as follows. For simplicity of notation, the products of the complex circular polarization ratios are defined as follows:

$$\rho_{cA} \rho_{cB} = M_{AB} \quad (11)$$

$$\rho_{cA} \rho_{cC} = M_{AC}$$

$$\rho_{cB} \rho_{cC} = M_{BC}$$

where the quantities $M_{AB}$, $M_{AC}$, and $M_{BC}$ are complex numbers derived from the data reduction.

The solutions for the circular polarization ratios are given by $$\rho_{cA} = \sqrt{\frac{M_{AB}M_{AC}}{M_{BC}}} \quad \rho_{cB} = \sqrt{\frac{M_{AB}M_{BC}}{M_{AC}}} \quad \rho_{cC} = \sqrt{\frac{M_{AC}M_{BC}}{M_{AB}}} \quad (12)$$

Resolution of the sign ambiguity inherent in taking the square root follows from an apriori knowledge of the approximate tilt angle of one of the three antennas.

Once the complex circular polarization ratio for an antenna is known, the axial ratio, tilt angle, and sense of polarization may be computed from it according to conventional techniques. Such computations are discussed in Hollis, J. S., Lyon, T. J. and Clayton, L., eds., *Microwave Antenna Measurements*, Scientific-Atlanta, Inc., Atlanta, GA, 1970, which is incorporated herein by this reference.

III. Experimental Results

A set of three single-ported antennas and one dual-ported, dual-polarized antenna was used to verify the measurement method. All possible combinations of the five antennas (the dual-ported antenna is considered to be two antennas and its two ports are referred to in the tables as antennas number 4 and number 5) were measured, with the results shown in Tables I and II, shown below.

For the single scan measurements shown in Table I the total variation in the measured axial ratio appears to be very large. However, because the axial ratio approaches infinity for nearly linear antennas, total variation in the axial ratio is a deceptive measure of accuracy. Note that the total variation in polar angle $2\gamma$ for all the antennas is 0.29°–0.44°. This is a true indication of the size of the locus of uncertainty on the Poincaré sphere, while axial ratio variation is not. Note in particular that for antenna #2, with an axial ratio of 28.44 dB, a 0.78 dB total variation corresponds to a larger locus of uncertainty on the Poincaré sphere than does the 5.67 dB variation for antenna number 3 with an axial ratio of 49.31 dB, the 9.44 dB variation for antenna number 4 with an axial ratio of 57.50 dB or the 2.74 dB variation for antenna number 5, with an axial ratio of 38.92 dB.

The single scan measurements shown in Table I indicate the degree of accuracy achievable using a one-dimensional discrete Fourier transform for reduction of the polarization pattern data. Such a DFT tends to reject random phase and amplitude errors in the measurement such as stray reflections in the test volume. However, periodic errors, such as rotary joint phase and VSWR wow, are not rejected by the one-dimensional DFT since they have the same period as the polarization pattern ($2\pi$). But these periodic errors (in particular, rotary joint errors) are dependent only on the rotation angle of one polarization positioner (the one in which they are mounted), while the polarization pattern is dependent on the rotation angle of both polarization positioners. Therefore, the periodic errors in the measurement do not vary in the same way as the polarization pattern does as a function of both measurement angles $\phi$ and $\chi$, and they will tend to be rejected by the two-dimensional DFT in $\phi$ and $\chi$ which is used to reduce multiple scan polarization measurements.

Table II shows the results of multiple scan measurements on the same antennas. For multiple scan measurements, periodic as well as random errors tend to be filtered out, resulting in a 2 or 3 to 1 improvement in measurement accuracy over single scan measurements. Work on computer-simulated data indicates that multiple-scan data reduction (a two-dimensional instead of a one-dimensional DFT) reduces periodic errors by about 20 dB.

TABLE I

RESULTS OF THREE-ANTENNA SINGLE SCAN POLARIZATION MEASUREMENTS

| Antenna Number | Polarization Parameter | THREE-ANTENNA SET | | | | | | | Nominal Value | Total Variation |
|---|---|---|---|---|---|---|---|---|---|---|
| | | 1 | 2 | 3 | 4 | 5 | 6 | 7 | | |
| 1 | Axial ratio (dB) | 46.30 | 47.82 | 47.14 | 59.85 | 56.58 | — | — | 53.40 | 13.55 |
| | Tilt angle (deg) | 88.95 | 88.94 | 88.94 | 89.07 | 89.01 | — | — | 88.98 | 0.13 |
| | Sense | RHK | RHK | RHK | RHK | RHK | — | — | RHK | — |
| | Polar angle $2\gamma$ (deg) | 90.56 | 90.47 | 90.50 | 90.12 | 90.17 | — | — | 90.36 | 0.44 |
| | Latitude $\delta_c$ (deg) | 177.91 | 177.89 | 177.87 | 178.14 | 178.02 | — | — | 177.97 | 0.27 |
| 2 | Axial ratio (dB) | 28.28 | 28.10 | 28.17 | — | — | 28.88 | 28.73 | 28.44 | 0.78 |
| | Tilt angle (deg) | 90.44 | 90.45 | 90.46 | — | — | 90.53 | 90.51 | 90.48 | 0.09 |
| | Sense | RHK | RHK | RHK | — | — | RHK | RHK | RHK | — |
| | Polar angle $2\gamma$ (deg) | 94.42 | 94.51 | 94.47 | — | — | 94.12 | 94.19 | 94.34 | 0.39 |
| | Latitude $\delta_c$ (deg) | −179.13 | −179.10 | −179.08 | — | — | −178.94 | −178.98 | −179.05 | 0.19 |
| 3 | Axial ratio (dB) | 45.51 | — | — | 50.24 | — | 51.18 | — | 49.31 | 5.67 |
| | Tilt angle (deg) | 179.58 | — | — | 179.54 | — | 179.48 | — | 179.53 | 0.10 |
| | Sense | LHK | — | — | LHK | — | LHK | — | LHK | — |
| | Polar angle $2\gamma$ (deg) | 89.39 | — | — | 89.65 | — | 89.68 | — | 89.57 | 0.29 |
| | Latitude $\delta_c$ (deg) | −0.84 | — | — | −0.91 | — | −1.04 | — | −0.93 | 0.20 |
| 4 | Axial ratio (dB) | — | 62.12 | — | — | 54.69 | — | 52.68 | 57.50 | 9.44 |
| | Tilt angle (deg) | — | 89.63 | — | — | 89.58 | — | 89.56 | 89.59 | 0.07 |
| | Sense | — | LHK | — | — | RHK | — | RHK | RHK | — |
| | Polar angle $2\gamma$ (deg) | — | 89.91 | — | — | 90.21 | — | 90.27 | 90.13 | 0.36 |
| | Latitude $\delta_c$ (deg) | — | 179.26 | — | — | 179.15 | — | 179.11 | 179.17 | 0.15 |
| 5 | Axial ratio (dB) | — | — | 40.80 | 38.06 | 38.39 | 38.29 | 38.75 | 38.92 | 2.74 |
| | Tilt angle (deg) | — | — | 91.46 | 91.33 | 91.39 | 91.39 | 91.41 | 91.40 | 0.13 |
| | Sense | — | — | RHK | RHK | RHK | RHK | RHK | RHK | — |
| | Polar angle $2\gamma$ (deg) | — | — | 91.05 | 91.43 | 91.38 | 91.40 | 91.32 | 91.32 | 0.38 |
| | Latitude $\delta_c$ (deg) | — | — | −177.08 | −177.35 | −177.23 | −177.22 | −177.19 | −177.21 | 0.27 |

Legend for table:

| Antenna set number | Antenna numbers |
|---|---|
| 1 | 1,2,3 |
| 2 | 1,2,4 |
| 3 | 1,2,5 |
| 4 | 1,3,5 |
| 5 | 1,4,5 |
| 6 | 2,3,5 |
| 7 | 2,4,5 |

TABLE II

RESULTS OF THREE-ANTENNA MULTIPLE SCAN POLARIZATION MEASUREMENTS

An-

TABLE II-continued

RESULTS OF THREE-ANTENNA MULTIPLE SCAN POLARIZATION MEASUREMENTS

| Antenna Number | Polarization Parameter | THREE-ANTENNA SET | | | | | | | Nominal Value | Total Variation |
|---|---|---|---|---|---|---|---|---|---|---|
| | | 1 | 2 | 3 | 4 | 5 | 6 | 7 | | |
| 1 | Axial ratio (dB) | 52.85 | 53.22 | 52.96 | 54.91 | 52.81 | — | — | 53.38 | 2.10 |
| | Tilt angle (deg) | 89.01 | 88.98 | 88.97 | 89.04 | 89.00 | — | — | 89.00 | 0.07 |
| | Sense | RHK | RHK | RHK | RHK | RHK | — | — | RHK | — |
| | Polar angle $2\gamma$ (deg) | 90.26 | 90.25 | 90.26 | 90.21 | 90.26 | — | — | 90.25 | 0.05 |
| | Longitude $\delta_c$ (deg) | 178.02 | 177.96 | 177.94 | 178.08 | 178.01 | — | — | 178.00 | 0.14 |
| 2 | Axial ratio (dB) | 28.67 | 28.66 | 28.80 | — | — | 28.91 | 28.78 | 28.76 | 0.25 |
| | Tilt angle (deg) | 90.43 | 90.47 | 90.49 | — | — | 90.51 | 90.52 | 90.48 | 0.09 |
| | Sense | RHK | RHK | RHK | — | — | RHK | RHK | RHK | — |
| | Polar angle $2\gamma$ (deg) | 94.22 | 94.22 | 94.16 | — | — | 94.11 | 94.17 | 94.18 | 0.11 |
| | Longitude $\delta_c$ (deg) | −179.14 | −179.06 | −179.02 | — | — | −178.98 | −178.96 | −179.03 | 0.18 |
| 3 | Axial ratio (dB) | 49.69 | — | — | 50.73 | — | 52.90 | — | 51.21 | 3.21 |
| | Tilt angle (deg) | 179.57 | — | — | 179.57 | — | 179.50 | — | 179.55 | 0.07 |
| | Sense | LHK | — | — | LHK | — | LHK | — | LHK | — |
| | Polar angle $2\gamma$ (deg) | 89.62 | — | — | 89.67 | — | 89.74 | — | 89.68 | 0.12 |
| | Longitude $\delta_c$ (deg) | −0.86 | — | — | −0.86 | — | −1.00 | — | −0.91 | 0.14 |
| 4 | Axial ratio (dB) | — | 55.05 | — | — | 55.70 | — | 52.69 | 54.57 | 3.01 |
| | Tilt angle (deg) | — | 89.62 | — | — | 89.59 | — | 89.56 | 89.59 | 0.06 |
| | Sense | — | RHK | — | — | RHK | — | RHK | RHK | — |
| | Polar angle $2\gamma$ (deg) | — | 90.20 | — | — | 90.19 | — | 90.27 | 90.22 | 0.08 |
| | Longitude $\delta_c$ (deg) | — | 179.24 | — | — | 179.18 | — | 179.12 | 179.18 | 0.12 |
| 5 | Axial ratio (dB) | — | — | 39.37 | 38.53 | 38.90 | 39.01 | 39.44 | 39.06 | 0.91 |
| | Tilt angle (deg) | — | — | 91.43 | 91.34 | 91.38 | 91.42 | 91.40 | 91.39 | 0.09 |
| | Sense | — | — | RHK | RHK | RHK | RHK | RHK | RHK | — |
| | Polar angle $2\gamma$ (deg) | — | — | 91.23 | 91.36 | 91.30 | 91.28 | 91.22 | 91.28 | 0.14 |
| | Longitude $\delta_c$ (deg) | — | — | −177.13 | −177.32 | −177.24 | −177.17 | −177.19 | 177.21 | 0.15 |

Legend for table:

| Antenna set number | Antenna numbers |
|---|---|
| 1 | 1,2,3 |
| 2 | 1,2,4 |
| 3 | 1,2,5 |
| 4 | 1,3,5 |
| 5 | 1,4,5 |
| 6 | 2,3,5 |
| 7 | 2,4,5 |

What is claimed is:

1. A method of measuring polarization of antennas utilizing three antenna methods and far-field scanning techniques comprising the steps of digitally recording, for at least one predetermined frequency, the normalized phasor voltage for transmission between each of three pairs of antennas in a three-antenna set as a function both of the roll angle of the first antenna and the roll angle of the second antenna in the pair and digitally processing the recorded data utilizing a two-dimensional Fourier transform to yield transformed values relating to polarizations of the antennas.

2. The method of claim 1 wherein the two-dimensional Fourier transform utilized is a Discrete Fourier Transform.

3. The method of claim 1 wherein the ratios of the transformed values yielded are the products of the circular polarization ratios for the two antennas in each pair.

4. A method for measuring polarization of antennas, comprising the steps of:

(a) positioning a first antenna as a first test antenna and a second antenna as a second test antenna, whereby said antennas share the same roll axis and are located a sufficient distance from one another to employ far-field scanning techniques;

(b) transmitting a continuous wave signal from one of the test antennas;

(c) rotating one of the test antennas about its roll axis through a predetermined angle and digitally recording normalized phasor voltage of the received signal as a function of the roll angle;

(d) rotating the other test antenna about its roll axis a predetermined incremental angle;

(e) repeating steps (b) and (c);

(f) repeating steps (d) and (e) for a predetermined number of incremental roll angles of the other test antenna;

(g) positioning the second antenna as the first test antenna and a third antenna as the second test antenna;

(h) repeating steps (b) through (f);

(i) positioning the first antenna as the first test antenna and the third antenna as the second test antenna;

(j) repeating steps (b) through (f); and (k) digitally processing the recorded data utilizing a two-dimensional Fourier transform to yield transformed values relating to the polarization of the first, second and third antennas.

5. A method for measuring polarization of antennas, comprising the steps of:

(a) positioning a first antenna as a transmitting antenna and a second antenna as a receiving antenna, whereby said antennas share the same roll axis and are located a sufficient distance from one another to employ far-field scanning techniques.

(b) transmitting a continuous wave signal from the transmitting antenna;

(c) rotating one of the antennas about its roll axis through a predetermined angle;

(d) digitally recording normalized phasor voltage of the received signal antenna as a function of said roll angle;

(e) rotating the other antenna about its roll axis a predetermined incremental angle;

(f) repeating steps (b) through (d);

(g) repeating steps (e) and (f) for a predetermined number of incremental roll angles of the other antenna;

(h) positioning the second antenna as the transmitting antenna and a third antenna as the receiving antenna;

(i) repeating steps (b) through (g);

(j) positioning the first antenna as the transmitting antenna and the third antenna as the receiving antenna;

(k) repeating steps (b) through (g); and (l) digitally processing the recorded data utilizing a two-dimensional Fourier transform to yield transformed values relating to the polarization of the first, second and third antennas.

6. A method for measuring polarization of antennas, comprising the steps of:

(a) positioning a first antenna as a transmitting antenna and a second antenna as a receiving antenna, whereby said antennas share the same roll axis and are located a sufficient distance from one another to employ far-field scanning techniques;

(b) transmitting a continuous wave signal from the transmitting antenna;

(c) rotating the receiving antenna about its roll axis through a predetermined angle;

(d) digitally recording normalized phasor voltage of the receiving antenna as a function of roll angle of the receiving antenna;

(e) rotating the transmitting antenna about its roll axis a predetermined incremental angle;

(f) repeating steps (b) through (d);

(g) repeating steps (e) and (f) for a predetermined number of incremental roll angles of the transmitting antenna;

(h) positioning the second antenna as the transmitting antenna and a third antenna as the receiving antenna;

(i) repeating steps (b) through (g);

(j) positioning the first antenna as the transmitting antenna and the third antenna as the receiving antenna;

(k) repeating steps (b) through (g); and (l) digitally processing the recorded data utilizing two-dimensional Fourier transform to yield transformed values relating to the polarization of the first, second and third antennas.

7. The method of claim 4 wherein the Fourier transform utilized is a Discrete Fourier Transform.

8. The method of claim 4 wherein the ratios of the transformed values yielded are the products of the circular polarization ratios for the two antennas in each pair.

9. The method of claim 4 wherein at least one of the antennas in each antenna pair is rotated about the roll axis through an angle of 180°.

10. The method of claim 4 wherein at least one of the antennas in each antenna pair is rotated about its roll axis through an angle which is an integral multiple of 180°.

11. The method of claim 4 wherein the predetermined incremental angle is at least 15°.

12. A method of measuring polarization of antennas utilizing three antenna methods and far-field scanning techniques comprising the steps of digitally recording, for at least one predetermined frequency, the normalized phasor voltage for transmission between each of three pairs of antennas in a three-antenna set as a function of the roll angle of one of the antennas in the pair, and digitally processing the recorded data utilizing a Discrete Fourier transform to yield transformed values relating to polarizations of the antennas.

13. The method of claim 12 wherein the ratios of the transformed values yielded are the products of the circular polarization ratios for the two antennas in each pair.

14. The method of claim 12 wherein said roll angle varies between 0° and 180°.

15. The method of claim 12 wherein said roll angle varies between 0° and an integral multiple of 180°.

16. A method for measuring polarization of antennas, comprising the steps of:

(a) positioning a first antenna and a second antenna on an antenna test range whereby said antennas share the same roll axis and are located a sufficient distance from one another to employ far-field scanning techniques;

(b) transmitting a continuous wave signal from one of the antennas;

(c) rotating one of the antennas about its roll axis through a predetermined angle and digitally recording normalized phasor voltage of the received signal as a function of the roll angle;

(d) positioning the second antenna and a third antenna on the antenna test range;

(e) repeating steps (b) through (c);

(f) positioning the first antenna and the third antenna on the antenna test range;

(g) repeating steps (b) through (c); and (h) digitally processing the received data utilizing a Discrete Fourier transform to yield transformed values related to the polarization of the first, second and third antennas.

17. The method of claim 16 wherein said roll angle varies between 0° and 180°.

18. The method of claim 16 wherein said roll angle varies between 0° and an integral multiple of 180°.

19. A method for measuring polarization of antennas, comprising the steps of:
(a) positioning a first antenna as a transmitting antenna and a second antenna as a receiving antenna, whereby said antennas share the same roll axis and are located a sufficient distance from one another to employ far-field scanning techniques;
(b) transmitting a continuous wave signal from the transmitting antenna;
(c) rotating one of the antennas about its roll axis through a predetermined angle;
(d) digitally recording normalized phasor voltage of the receiving antenna as a function of roll angle of the antenna being rotated;
(e) positioning the second antenna as the transmitting antenna and a third antenna as the receiving antenna;
(f) repeating steps (b) through (d);
(g) positioning the first antenna as the transmitting antenna and the third antenna as the receiving antenna;
(h) repeating steps (b) through (d); and
(i) digitally processing the received data utilizing a Discrete Fourier transform to yield transformed values related to the polarization of the first, second and third antennas.

20. A method for measuring polarization of antennas, comprising the steps of:
(a) positioning a first antenna as a first test antenna and a second antenna as a second test antenna, whereby said antennas share the same roll axis and are located a sufficient distance from one another to employ far-field scanning techniques;
(b) while rotating one of the test antennas about its roll axis through a predetermined angle:
(i) transmitting from one of the test antennas, during the rotating test antenna's sweep of a predetermined portion of the predetermined angle, a set of continuous wave signals at predetermined frequencies;
(ii) digitally recording normalized phasor voltages of the received set of predetermined frequencies, as a function of roll angle; and
(iii) repeating steps (i) and (ii) for all portions of the predetermined angle;
(c) rotating the other test antenna about its roll axis a predetermined incremental angle;
(d) repeating steps (b) and (c) for a predetermined number of incremental roll angles of the other test antenna;
(e) positioning the second antenna as the first range antenna and a third antenna as the second test antenna;
(f) repeating steps (b) through (d);
(g) positioning the first antenna as the first test antenna and the third antenna as the second test antenna;
(h) repeating steps (b) through (d); and
(i) digitally processing the received data utilizing a two-dimensional Fourier transform to yield transformed values relating to the polarization of the first, second and third antennas.

21. A method for measuring polarization of antennas, comprising the steps of:
(a) positioning a first antenna and a second antenna on an antenna test range whereby said antennas share the same roll axis and are located a sufficient distance from one another to employ far-field scanning techniques;
(b) while rotating one of the antennas about its roll axis through a predetermined angle:
(i) transmitting from one of the antennas, during the rotating antennas' sweep of a predetermined portion of a predetermined angle, a set of continuous wave signals at predetermined frequencies;
(ii) digitally recording normalized phasor voltages of the received set of predetermined frequencies, as a function of roll angle; and
(iii) repeating steps (i) and (ii) for all portions of the predetermined angle;
(c) positioning the second antenna and a third antenna on the antenna test range;
(d) repeating step (b);
(e) positioning the first antenna and the third antenna on the antenna test range;
(f) repeating step (b); and
(g) digitally processing the received data utilizing a Discrete Fourier Transform to yield transformed values related to the polarization of the first, second and third antennas.

22. A method of measuring polarization of antennas utilizing three antenna methods and far-field scanning techniques comprising the steps of recording data for each of the three pairs of antennas in a three antenna set as a function both of the roll angle of the first antenna and the roll angle of the second antenna in the pair and processing the recorded data.

23. The method of claim 22 wherein the data comprises normalized phasor voltage between each of the three pairs of antennas.

24. The method of claim 23 wherein the data is digitally recorded and the step of processing the recorded data comprises utilizing a two-dimensional Fourier transform to yield transformed values relating to polarization of the antennas.

25. The method of claim 24 wherein the ratios of the transformed values yielded are the products of the circular polarization ratios for the two antennas in each pair.

* * * * *